(12) United States Patent
Clark et al.

(10) Patent No.: US 7,582,574 B2
(45) Date of Patent: Sep. 1, 2009

(54) DIETHYLSILANE AS A SILICON SOURCE IN THE DEPOSITION OF METAL SILICATE FILMS

(75) Inventors: Robert Daniel Clark, Schenectady, NY (US); Hareesh Thridandam, Vista, CA (US); Kirk Scott Cuthill, Vista, CA (US); Arthur Kenneth Hochberg, Solana Beach, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 11/747,019

(22) Filed: May 10, 2007

(65) Prior Publication Data

US 2007/0281475 A1 Dec. 6, 2007

Related U.S. Application Data

(60) Provisional application No. 60/809,255, filed on May 30, 2006.

(51) Int. Cl.
*H01L 21/31* (2006.01)
*H01L 21/469* (2006.01)

(52) U.S. Cl. .............. 438/785; 257/E21.295; 257/E21.009; 427/255.394; 427/255.32

(58) Field of Classification Search .......... 438/785; 257/E21.295, E21.267, E21.269, E21.192, 257/E21.009; 427/255.394, 255.32, 255.36
See application file for complete search history.

(56) References Cited

U.S. PATENT DOCUMENTS

| 5,040,046 | A | 8/1991 | Chhabra et al. |
| 5,250,473 | A | 10/1993 | Smits |
| 5,776,236 | A * | 7/1998 | Neuman et al. ........ 106/287.17 |
| 6,537,613 | B1 | 3/2003 | Senzaki et al. |
| 6,841,439 | B1 | 1/2005 | Anthony et al. |
| 2002/0187371 | A1 | 12/2002 | Nakajima |
| 2003/0015249 | A1 * | 1/2003 | Jursich ............ 141/4 |
| 2005/0139937 | A1 | 6/2005 | Kamiyama et al. |
| 2006/0273408 | A1 * | 12/2006 | Kamiyama et al. .......... 257/401 |
| 2008/0044569 | A1 * | 2/2008 | Myo et al. ............. 427/248.1 |

FOREIGN PATENT DOCUMENTS

| EP | 1146140 A1 | 10/2001 |
| EP | 1548839 A1 | 6/2005 |
| WO | 02/079211 A1 | 10/2002 |

OTHER PUBLICATIONS

Wilk, G.D., R.M. Wallace, and J.M. Anthony. Hafnium and zirconium silicates for advanced gate dielectrics. Journal of Applied Physics. Jan. 1, 2000. p. 484-492. vol. 87. American Institute of Physics.

* cited by examiner

*Primary Examiner*—Caridad M Everhart
(74) *Attorney, Agent, or Firm*—Lina Yang

(57) ABSTRACT

A method for forming a metal silicate as a high k dielectric in an electronic device, comprising the steps of: providing diethylsilane to a reaction zone; concurrently providing a source of oxygen to the reaction zone; concurrently providing a metal precursor to the reaction zone; reacting the diethylsilane, source of oxygen and metal precursor by chemical vapor deposition to form a metal silicate on a substrate comprising the electronic device. The metal is preferably hafnium, zirconium or mixtures thereof. The dielectric constant of the metal silicate film can be tuned based upon the relative atomic concentration of metal, silicon, and oxygen in the film.

16 Claims, 2 Drawing Sheets

DIETHYLSILANE AS A SILICON SOURCE IN THE DEPOSITION OF METAL SILICATE FILMS

CROSS REFERENCE TO RELATED APPLICATIONS

This application claims the benefit of U.S. Provisional Patent Application Ser. No. 60/809,255 filed May 30, 2006.

BACKGROUND OF THE INVENTION

The electronics fabrication industry uses metal silicate films of zirconium or hafnium in the fabrication of electronic devices, such as used for high dielectric constant materials and gate dielectric films.

Metal silicates for electronic materials have been studied by those skilled in the art. For instance, Wilk, et. al., Hafnium and Zirconium silicates for advanced gate dielectrics, Journal of Applied Physics, Vol. 87, No. 1, 2000, pp. 484-492 describe the use of metal silicates as gate dielectric films with varying metal contents. Depositions were by sputtering and e-beam evaporation. Separate films were deposited at specific temperatures chosen over the range of 25° C. to 600° C.

U.S. Pat. No. 6,841,439 identifies metal silicates as desirable gate dielectric films and describes various synthesis routes.

US Pat. Appl. Pub. No. US 2005/0139937 A1 Pub. Date: Jun. 30, 2005, describes the growth of hafnium silicate films by atomic layer deposition, a process whereby the hafnium, silicon, and oxygen sources are alternately fed to and purged from the deposition chamber. The growth rates of the atomic layer deposition process are very low.

The present invention overcomes this deficiency by co-feeding the metal, silicon, and oxygen sources simultaneously to the deposition chamber in a chemical vapor deposition.

BRIEF SUMMARY OF THE INVENTION

One embodiment of the present invention is a method for forming a metal silicate as a high k dielectric in an electronic device, comprising the steps of: providing diethylsilane to a reaction zone; concurrently providing a source of oxygen to the reaction zone; concurrently providing a metal precursor to the reaction zone; reacting the diethylsilane, source of oxygen and metal precursor by chemical vapor deposition to form a metal silicate on a substrate.

Another embodiment of the present invention is a method for forming hafnium silicate as a high k dielectric in an electronic device, comprising the steps of:
providing diethylsilane to a reaction zone;
concurrently providing a source of oxygen to the reaction zone;
concurrently providing tetrakis(diethylamino)hafnium to the reaction zone;
reacting the diethylsilane, source of oxygen and tetrakis (diethylamino)hafnium by chemical vapor deposition to form hafnium silicate on a substrate comprising the electronic device.

Another embodiment of the present invention is a method for forming zirconium silicate as a high k dielectric in an electronic device, comprising the steps of:
providing diethylsilane to a reaction zone;
concurrently providing a source of oxygen to the reaction zone;
concurrently providing tetrakis(diethylamino)zirconium to the reaction zone;
reacting the diethylsilane, source of oxygen and tetrakis (diethylamino)zirconium by chemical vapor deposition to form zirconium silicate on a substrate comprising the electronic device.

The present invention also shows that the metal silicate film dielectric constant can be tuned based upon the relative atomic concentration of metal, silicon, and oxygen in the film.

DETAILED DESCRIPTION OF THE INVENTION

Figure 1:
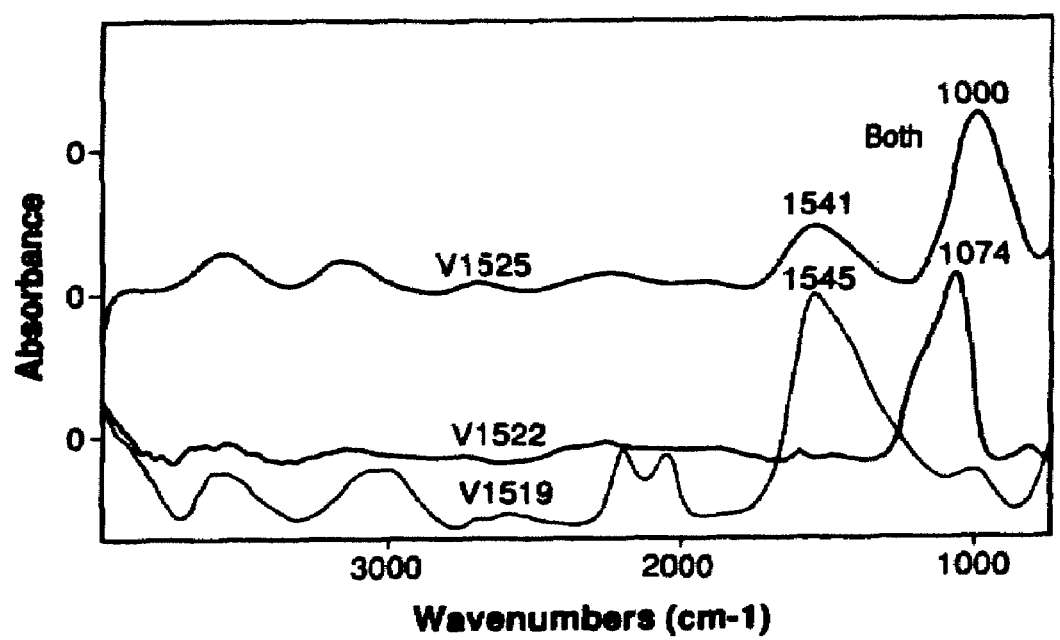
FIG. 1 shows the absorbance as a function of Wavenumbers ($cm^{-1}$) for films deposited from: a zirconium oxide film from $Zr(N(CH_2CH_3)_2)_4$ alone—V1519; a silicon oxide film from Diethylsilane alone—V1522; and a zirconium silicate film from $Zr(N(CH_2CH_3)_2)_4$ and Diethylsilane—V1525; in accordance with Table III.

The present invention is directed to the formation of metal silicates as high k dielectrical for an electronic device. The metal, silicon, and oxygen sources are simultaneously fed to the deposition chamber in a chemical vapor deposition. Among the silicon sources, diethylsilane has been selected in the deposition of metal silicate films in the present invention. The growth rate of the metal silicate is faster than that achieved by atomic layer deposition. Lower carbon contamination in metal silicate films are found as compared with our previously reported and demonstrated process, U.S. Pat. No. 6,537,613 (which is hereby specifically incorporated by reference in their entirety herein), that uses silicon amides as the silicon source. Lower carbon contamination results in higher dielectric constants. Another benefit is that silicon incorporation into these films can be achieved at lower process temperatures as compared with a process that uses silicon amides as the silicon source; the thermal process budget is reduced (and, thus, process cost is reduced). And most importantly, the present invention also shows that the dielectric constant of the metal silicate film can be tuned based upon the atomic concentration of metal, silicon, and oxygen in the film.

A Chemical Vapor Deposition (CVD) system is configured to simultaneously receive metal precursor feed by Direct Liquid Injection (DLI) (converted to vapor before the reaction zone), silicon precursor vapor feed by Vapor Draw, and oxygen reactant gas feed into the reaction zone above the heated substrate. The temperature and pressure of the reaction zone are established; and the precursor vapor and reactant gas flows are established prior to introduction into the reaction zone. A substrate is introduced into the reaction zone and allowed to equilibrate to the temperature and pressure of the reaction zone. The precursor vapor and reactant gas flows are introduced into the reaction zone and are allowed to flow for a time sufficient to grow a metal silicate film.

The operating conditions are: pressure ranging from 0.5 to 2 Torr; substrate temperature ranging from 250° C.-450° C.; DLI vaporizer temperature ranging from 85° C.-95° C.; metal precursor flow rate ranging from 0.05 to 0.1 ml/min; helium carrier gas flow ranging from 100 to 150 sccm (Standard Cubic Centimeters per Minute); silicon precursor flow rate ranging from 5 to 100 sccm; helium dilution gas flow rate ranging from 0 to 50 sccm, residence time ranging from 0.05 to 2 seconds.

WORKING EXAMPLES

The present invention is illustrated in the following examples.

Example 1

Zr—Si—O Thin Film

Reactants used in the Zr—Si—O thin film deposition were:
1) Tetrakis(DiEthylAmino)Zirconium(IV)—TDEAZ, $Zr(N(CH_2CH_3)_2)_4$;
2) diethylsilane—DES (LTO-410), $SiH_2(CH_2CH_3)_2$; and
3) oxygen, $O_2$.

Liquid Tetrakis(DiEthylAmino)Zirconium(IV) was delivered at 0.1 mL per minute to a direct liquid injection system with subsequent a vaporization at a temperature of 90° C. using a helium sweep gas flow of 100 sccm into a manifold that feeds a precursor delivery ring situated below the gas showerhead in a single wafer, cold wall LPCVD reactor. Diethylsilane vapor was simultaneously delivered at 6.3 sccm through a 100 sccm nitrogen Mass Flow Controller (MFC) (equivalent to 18 sccm full scale flow of diethylsilane) into the aforementioned manifold. Flows of oxygen varied between 100 sccm and 150 ccm, were delivered to the showerhead of this reactor. These three flows were simultaneously directed onto a silicon wafer that was maintained at temperatures between 250° C. and 450° C. on a resistively heated wafer pedestal. The reactor chamber pressure was varied between 1 Torr and 1.5 Torr.

Table I shows the process parameters required to deposit a $ZrO_2$ film from $Zr(N(CH_2CH_3)_2)_4$ and $O_2$; "TDEAZ Only".

Table II shows the process parameters required to deposit a $SiO_2$ film from $SiH_2(CH_2CH_3)_2$ and $O_2$; "DES Only".

Table III shows the process parameters required to deposit a Zr—Si—O film by simultaneously delivering $Zr(N(CH_2CH_3)_2)_4$, $SiH_2(CH_2CH_3)_2$ and $O_2$ to the reaction chamber; "TDEAZ and DES".

As shown in Table I, a high deposition rate and high index of refraction were obtained for $ZrO_2$ film.

As shown in Table II, a relatively lower index of refraction was obtained from $SiO_2$ film. The deposition rate varied.

Table III indicates a relatively lower deposition rate of the zirconium silicate film. The index of refraction of Zr—Si—O film is much higher than the index of refraction of $SiO_2$ film, and thus the high dielectric constant k of Zr—Si—O film.

TABLE I

TDEAZ Only

| Run | Wafer Temp (° C.) | Press (mTorr) | DLI (ml/min) | He Swp (sccm) | DES (sccm) | $O_2$ (sccm) | Run time (min) | Index of Ref. n | Thickness (Å) | Dep Rate (Å/min) |
|---|---|---|---|---|---|---|---|---|---|---|
| V1519 | 296 | 1000 | 0.1 | 100 | 0 | 100 | 2.5 | 2.146 | 2618 | 1047 |
| V1520 | 316 | 1000 | 0.1 | 100 | 0 | 100 | 1.2 | 2.143 | 1857 | 1592 |
| V1521 | 277 | 1000 | 0.1 | 100 | 0 | 100 | 3.5 | 2.092 | 2412 | 689 |

TABLE II

DES Only

| Run | Wafer Temp (° C.) | Press (mTorr) | DLI (ml/min) | He Swp (sccm) | DES (sccm) | $O_2$ (sccm) | Run time (min) | Index of Ref. n | Thickness (Å) | Dep Rate (Å/min) |
|---|---|---|---|---|---|---|---|---|---|---|
| V1522 | 400 | variable | 0 | 0 | variable | 100 | na | 1.444 | variable | variable |

TABLE III

TDEAZ and DES

| Run | Wafer Temp (° C.) | Press (mTorr) | DLI (ml/min) | He Swp (sccm) | DES (sccm) | $O_2$ (sccm) | Run time (min) | Index of Ref. n | Thickness (Å) | Dep Rate (Å/min) |
|---|---|---|---|---|---|---|---|---|---|---|
| | | | | DES injected through ring | | | | | | |
| V1525 | 405 | 1500 | 0.1 | 100 | 6.3 | 100 | 1.5 | 1.942 | 923 | 615 |
| V1526 | 405 | 1500 | 0.1 | 150 | 6.3 | 100 | 1.5 | 1.882 | 931 | 621 |
| V1527 | 405 | 1500 | 0.1 | 100 | 6.3 | 150 | 2 | 1.711 | 606 | 303 |

FIG. 1 shows the individual FTIR spectra of the $ZrO_2$, $SiO_2$, and the Zr—Si—O films superimposed on each other. Run V1519 is the spectrum of the $ZrO_2$ film. The absorbance at 1545 wavenumbers is the indication of a Zr—O—Zr stretch. Run V1522 is the spectrum of the $SiO_2$ film. The absorbance at 1074 wavenumbers is the characteristic of the Si—O—Si stretch. Run V1525 is the spectrum of the Zr—Si—O film; it exhibits the characteristic peaks of both the individual oxides, and thus indicates the characteristics of a Zr—Si—O film.

Example 2

Hf—Si—O Thin Film

Similar experiments as shown in Example 1 have been performed for Hf—Si—O thin film. Note that, chemical properties of Hafnium and Zirconium are very similar since they belong to the same group in the periodic table.

Reactants used in the Hf—Si—O thin film deposition were:

1) Tetrakis(DiEthylAmino)Hafnium(IV)—TDEAH, Hf(N(CH$_2$CH$_3$)$_2$)$_4$;
2) diethylsilane—DES (LTO-410), SiH$_2$(CH$_2$CH$_3$)$_2$; and
3) oxygen, O$_2$.

Liquid Tetrakis(DiEthylAmino)Hafnium(IV) was delivered at 0.1 mL per minute to a direct liquid injection system with subsequent a vaporization at a temperature of 90° C. using a helium sweep gas flow of 100 sccm into a manifold that feeds a precursor delivery ring situated below the gas showerhead in a single wafer, cold wall LPCVD reactor. Diethylsilane vapor was simultaneously delivered at 6.3 to 45 sccm through a 500 sccm nitrogen MFC (equivalent to 90 sccm full scale flow of diethylsilane) into the aforementioned manifold. Flows of oxygen varied between 75 sccm and 100 sccm, were delivered to the showerhead of this reactor. These three flows were simultaneously directed onto a silicon wafer that was maintained by heater set point, which was at 650° C. and 700° C., on a resistively heated wafer pedestal. The reactor chamber pressure was varied between 0.5 Torr and 1.5 Torr.

Table IV shows the process parameters required to deposit an HfO$_2$ film from Hf(N(CH$_2$CH$_3$)$_2$)$_4$ and O$_2$; "TDEAH Only".

Table V shows the process parameters required to deposit a Hf—Si—O film by simultaneously delivering Hf(N(CH$_2$CH$_3$)$_2$)$_4$, SiH$_2$(CH$_2$CH$_3$)$_2$ and O$_2$ to the reaction chamber; "TDEAH and DES".

Again, as for the Zi—Si—O films, Table IV indicates that the index of refraction of Hf—Si—O film is much higher than the index of refraction of SiO$_2$ film, and thus the high dielectric constant k of Hf—Si—O film.

Most importantly, Table V also indicates that the index of refraction of Hf—Si—O films vary with the relative concentration (represented by the flow rates) of hafnium, silicon, and oxygen used in the CVD process.

Figure 2:
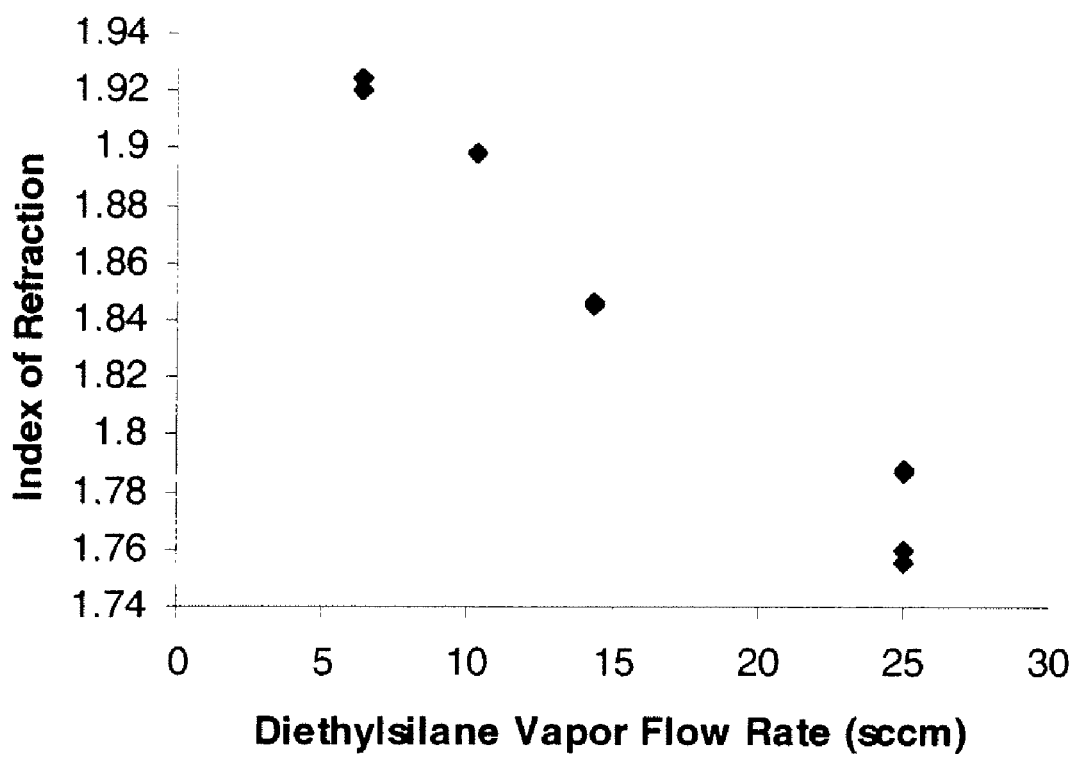
FIG. 2 shows the index of refraction of Hf—Si—O films as a function of the flow rate (sccm) of $SiH_2(CH_2CH_3)_2$; in accordance with Table V.

As an example, FIG. 2 shows the index of refraction of Hf—Si—O films as a function of the flow rate (sccm) of SiH$_2$(CH$_2$CH$_3$)$_2$, in accordance with Table V. The silicon precursor flow rate varied from 6.3 sccm to 25 sccm; while the other conditions were kept unchanged. The pressure was at 1.5 Torr; the wafer temperature was at 492° C.; metal (Hafnium) precursor flow rate was at 0.1 ml/min; helium carrier gas flow was at 100 sccm; helium dilution gas flow rate was at 0 sccm; and oxygen flow rate was at 100 sccm.

TABLE IV

TDEAH Only

| Run | Wafer Temp (° C.) | Press (mTorr) | DLI (ml/min) | He Swp (sccm) | O$_2$ (sccm) | Run time (min) | Index of Ref. n | Thickness (Å) | Dep Rate (Å/min) | FTIR Peak (cm$^{-1}$) |
|---|---|---|---|---|---|---|---|---|---|---|
| V1541 | 255 | 1000 | 0.1 | 100 | 100 | 5 | 1.954 | 784 | 156.8 | 1582.6 |
|  |  |  |  |  |  |  | 1.957 | 810 | 162.0 | 1583 |
|  |  |  |  |  |  |  | 2.177 | 891 | 178.2 | 2210 |
| V1542 | 253 | 1000 | 0.1 | 100 | 100 | 5 | 1.959 | 737 | 147.4 | 1574 |
|  |  |  |  |  |  |  | 1.968 | 850 | 170.0 | 2210 |
|  |  |  |  |  |  |  | 1.972 | 918 | 183.6 |  |

TABLE V

TDEAH and DES

| Run | Wafer Temp (° C.) | Press (Torr) | DLI (ml/min) | DES (sccm) | O$_2$ (sccm) | He dilute (sccm) | Dep Time (min) | Dep Rate (Å/min) | Thickness (Å) | Index of Ref. n |
|---|---|---|---|---|---|---|---|---|---|---|
| 1443-47-1 | 492 | 1.5 | 0.1 | 6.3 | 100 | — | 1.5 | 898 | 1347 | 1.9201 |
| 1443-47-2 | 492 | 1.5 | 0.1 | 6.3 | 100 | — | 1.5 | 1068 | 1602 | 1.9246 |
| 1443-48-1 | 492 | 1.5 | 0.1 | 10.3 | 100 | — | 1.5 | 1031 | 1546 | 1.8983 |
| 1443-48-2 | 492 | 1.5 | 0.1 | 14.3 | 100 | — | 1.5 | 999 | 1499 | 1.8459 |
| 1443-48-3 | 492 | 1.5 | 0.1 | 14.3 | 100 | — | 1.6 | 1093 | 1748 | 1.8451 |
| 1443-48-4 | 492 | 1.5 | 0.1 | 25 | 100 | — | 1.5 | 1477 | 2216 | 1.7599 |
| 1443-48-5 | 492 | 1.5 | 0.1 | 25 | 100 | — | 1 | 1417 | 1417 | 1.7870 |
| 1443-49-1 | 523 | 1.5 | 0.1 | 25 | 100 | 30 | 1 | 879 | 879 | 1.7881 |
| 1443-49-2 | 523 | 1.5 | 0.1 | 25 | 100 | 15 | 1 | 1366 | 1366 | 1.7558 |
| 1443-49-3 | 523 | 1.5 | 0.1 | 25 | 75 | 15 | 1 | 831 | 831 | 1.7095 |
| 1443-49-4 | 523 | 1.5 | 0.1 | 25 | 75 | 30 | 2.5 | 1408 | 3519 | 1.8332 |
| 1443-50-1 | 523 | 1.5 | 0.1 | 25 | 75 | 30 | 1 | 570 | 570 | 1.6874 |
| 1443-50-2 | 523 | 1.5 | 0.1 | 25 | 75 | 30 | 2.5 | 578 | 1444 | 1.7707 |
| 1443-50-3 | 523 | 1.5 | 0.1 | 25 | 75 | 0 | 1 | 164 | 164 | 1.3200 |
| 1443-50-4 | 511 | 1 | 0.1 | 25 | 100 | 0 | 1 | 1357 | 1357 | 1.8047 |
| 1443-50-5 | 493 | 0.5 | 0.1 | 25 | 100 | 0 | 1 | 1061 | 1061 | 1.8920 |
| 1443-50-6 | 493 | 0.5 | 0.1 | 25 | 100 | 5 | 1 | 1049 | 1049 | 1.9014 |

TABLE V-continued

TDEAH and DES

| Run | Wafer Temp (° C.) | Press (Torr) | DLI (ml/min) | DES (sccm) | O₂ (sccm) | He dilute (sccm) | Dep Time (min) | Dep Rate (Å/min) | Thickness (Å) | Index of Ref. n |
|---|---|---|---|---|---|---|---|---|---|---|
| 1443-51-1 | 493 | 0.5 | 0.05 | 25 | 100 | 5 | 1 | 792 | 792 | 2.0525 |
| 1443-51-2 | 511 | 1 | 0.1 | 45 | 100 | 15 | 1 | 1084 | 1084 | 1.7652 |
| 1443-51-3 | 511 | 1 | 0.1 | 45 | 100 | 10 | 1 | 1321 | 1321 | 1.7887 |

The salient feature shown in FIG. 2 is the index of refraction of the Hf—Si—O films (thus the dielectric constant of the Hf—Si—O film) decreases approximately linearly as the flow rate of the silicon precursor (thus the relative atomic concentration of silicon) increases. Therefore, FIG. 2 clearly indicates that the dielectric constant of hafnium silicate films can be tuned based upon the atomic concentration of hafnium, silicon, and oxygen in the film.

The embodiments of the present invention listed above, including the working examples, are exemplary of numerous embodiments that may be made of the present invention. It is contemplated that numerous other configurations of the process may be used, and the materials used in the process may be selected from numerous materials other than those specifically disclosed. In short, the present invention has been set forth with regard to particular embodiments, but the full scope of the present invention should be ascertained from the claims as follow.

The invention claimed is:

1. A method for forming a metal silicate as a high k dielectric in an electronic device, comprising the steps of:
    providing diethylsilane at a flow rate of 5 to 100 standard cubic centimeters per minute to a reaction zone;
    concurrently providing a source of oxygen to the reaction zone;
    concurrently providing a metal precursor at a flow rate of 0.05 to 0.1 milliliters per minute to the reaction zone;
    reacting the diethylsilane, source of oxygen and metal precursor by chemical vapor deposition to form a metal silicate on a substrate comprising the electronic device.

2. The method of claim 1 wherein the source of oxygen is selected from the group consisting of oxygen gas, air, ozone and mixtures thereof.

3. The method of claim 1 wherein the residence time of the diethylsilane, source of oxygen and metal precursor in the reaction is in the range of 0.05 to 2 seconds.

4. The method of claim 1 wherein the high k of metal silicate is changed by varying relative atomic concentration of metal precursor, diethylsilane, and oxygen in the reaction zone.

5. The method of claim 1 wherein the metal precursor is selected from the group consisting of metal amide, metal alkoxide and mixtures thereof.

6. The method of claim 5 wherein the metal is selected from the group consisting of hafnium, zirconium, and mixtures thereof.

7. The method of claim 1 wherein the diethylsilane, source of oxygen and metal precursor are reacted under chemical vapor deposition conditions.

8. The method of claim 7 wherein the chemical vapor deposition conditions comprise a pressure in the range of 0.5 to 2 Torr, and a temperature in the range of 250° C. to 450° C.

9. The method of claim 8 wherein a sweep gas is in the range of 100 to 150 standard cubic centimeters per minute.

10. The method of claim 9 wherein the sweep gas is selected from the group consisting of helium, argon, nitrogen and mixtures thereof.

11. A method for forming hafnium silicate as a high k dielectric in an electronic device, comprising the steps of:
    providing diethylsilane at a flow rate of 5 to 100 standard cubic centimeters per minute to a reaction zone;
    concurrently providing a source of oxygen to the reaction zone;
    concurrently providing tetrakis(diethylamino)hafnium at a flow rate of 0.05 to 0.1 milliliters per minute to the reaction zone;
    reacting the diethylsilane, source of oxygen and tetrakis(diethylamino)hafnium by chemical vapor deposition to form hafnium silicate on a substrate comprising the electronic device.

12. The method of claim 11 wherein the high k of hafnium silicate is changed by varying relative atomic concentration of tetrakis(diethylamino)hafnium, diethylsilane, and oxygen in the reaction zone.

13. The method of claim 11 wherein the chemical vapor deposition conditions comprise a pressure in the range of 0.5 to 2 Torr, and a temperature in the range of 250° C. to 450° C.

14. A method for forming zirconium silicate as a high k dielectric in an electronic device, comprising the steps of:
    providing diethylsilane at a flow rate of 5 to 100 standard cubic centimeters per minute to a reaction zone;
    concurrently providing a source of oxygen to the reaction zone;
    concurrently providing tetrakis(diethylamino)zirconium at a flow rate of 0.05 to 0.1 milliliters per minute to the reaction zone;
    reacting the diethylsilane, source of oxygen and tetrakis(diethylamino)zirconium by chemical vapor deposition to form zirconium silicate on a substrate comprising the electronic device.

15. The method of claim 14 wherein the high k of zirconium silicate is changed by varying relative atomic concentration of tetrakis(diethylamino)zirconium, diethylsilane, and oxygen in the reaction zone.

16. The method of claim 14 wherein the chemical vapor deposition conditions comprise a pressure in the range of 0.5 to 2 Torr, and a temperature in the range of 250° C. to 450° C.

* * * * *